(12) United States Patent
Takeda (10) Patent No.: US 11,072,859 B2
(45) Date of Patent: Jul. 27, 2021

(54) SUBSTRATE PROCESSING APPARATUS, METHOD OF MANUFACTURING SEMICONDUCTOR DEVICE, AND RECORDING MEDIUM

(71) Applicant: HITACHI KOKUSAI ELECTRIC INC., Tokyo (JP)

(72) Inventor: Tsuyoshi Takeda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 483 days.

(21) Appl. No.: 15/444,434

(22) Filed: Feb. 28, 2017

(65) Prior Publication Data
US 2017/0283950 A1 Oct. 5, 2017

(30) Foreign Application Priority Data
Mar. 29, 2016 (JP) .............................. JP2016-065706

(51) Int. Cl.
*C23C 16/50* (2006.01)
*H01J 37/32* (2006.01)
*C23C 16/44* (2006.01)
*C23C 16/455* (2006.01)
*C23C 16/452* (2006.01)
(Continued)

(52) U.S. Cl.
CPC ............ *C23C 16/50* (2013.01); *C23C 16/401* (2013.01); *C23C 16/402* (2013.01);
(Continued)

(58) Field of Classification Search
CPC . C23C 16/50; C23C 16/45578; C23C 16/452; C23C 16/4412; C23C 16/402;
(Continued)

(56) References Cited

U.S. PATENT DOCUMENTS

| 4,979,467 A | * | 12/1990 | Kamaji | ............... C23C 16/5096 118/723 E |
| 2009/0120582 A1 | * | 5/2009 | Koshimizu | ......... H01J 37/3244 156/345.34 |
| 2011/0088847 A1 | * | 4/2011 | Law | ................. H01J 37/32449 156/345.34 |
| 2011/0124204 A1 | * | 5/2011 | Ota | ....................... C23C 16/402 438/787 |
| 2013/0084712 A1 | | 4/2013 | Yuasa et al. | |

FOREIGN PATENT DOCUMENTS

CN 101431009 A 5/2009
CN 103035485 A 4/2013
(Continued)

OTHER PUBLICATIONS

JP2004296526 English Machine Translation retrieved from ESPACENET Aug. 14, 2019 (Year: 2019).*
(Continued)

*Primary Examiner* — Rakesh K Dhingra
*Assistant Examiner* — Laureen Chan
(74) *Attorney, Agent, or Firm* — Volpe Koenig (57) ABSTRACT

In a process chamber in which a substrate is processed, a gas supply unit is in the process chamber and configured to supply a process gas that processes the substrate. A plasma generation unit is in the process chamber and configured to activate the process gas, and a buffer part is configured to form a buffer chamber accommodating at least a part of the plasma generation unit and include a gas supply hole through which the activated process gas is supplied to the substrate. The buffer part includes a groove portion in which a part of the gas supply hole is cut out.

4 Claims, 8 Drawing Sheets

(51) Int. Cl.
*C23C 16/40* (2006.01)
*H01L 21/02* (2006.01)

(52) U.S. Cl.
CPC ........ *C23C 16/4412* (2013.01); *C23C 16/452* (2013.01); *C23C 16/455* (2013.01); *C23C 16/45578* (2013.01); *H01J 37/3244* (2013.01); *H01J 37/32357* (2013.01); *H01L 21/02208* (2013.01); *H01J 37/32779* (2013.01); *H01L 21/0228* (2013.01); *H01L 21/02164* (2013.01); *H01L 21/02219* (2013.01); *H01L 21/02274* (2013.01)

(58) Field of Classification Search
CPC ...... C23C 16/401; C23C 16/455; H01J 37/00; H01J 37/3244; H01J 37/32357; H01L 21/02208; H01L 21/02219; H01L 21/02274; H01L 21/02164; H01L 21/0228
See application file for complete search history.

(56) References Cited

FOREIGN PATENT DOCUMENTS

| JP | 2003-224113 | A | | 8/2003 |
|----|------------|---|---|--------|
| JP | 2004-296526 | A | | 10/2004 |
| JP | 2004296526 | A | * | 10/2004 |
| JP | 2009-117711 | A | | 5/2009 |
| JP | 4526540 | B2 | | 8/2010 |
| KR | 2013-0035874 | A | | 4/2013 |

OTHER PUBLICATIONS

Korean Office Action dated Aug. 17, 2018 for the Korean Patent Application No. 10-2017-0024019.
Chinese Office Action dated Oct. 14, 2020 for Chinese Patent Application No. 201710096228.9.

* cited by examiner

SUBSTRATE PROCESSING APPARATUS, METHOD OF MANUFACTURING SEMICONDUCTOR DEVICE, AND RECORDING MEDIUM

BACKGROUND

Technical Field

The present disclosure relates to a substrate processing apparatus, a method of manufacturing a semiconductor device, and a non-transitory computer-readable recording medium.

Related Art

As one of the processes of manufacturing a semiconductor device, substrate processing is performed by loading a substrate into a process chamber of a substrate processing apparatus, forming various films, such as an insulating film, a semiconductor film, a conductor film, or the like, on the substrate by supplying a source gas and a reactant gas into the process chamber, and removing various films.

SUMMARY

In the recent mass-produced devices which require the above-described substrate processing and in which patterns to be formed become fine, there is a need to improve a film quality of a film to be formed by performing substrate processing at a low temperature so that diffusion of impurities can be suppressed and a material having low heat resistance, such as an organic material, can be used.

It is an object of the present disclosure to provide a technology that is a capable of improving a film quality of a film to be formed.

According to one aspect of the present disclosure, there is provided a technology including: a process chamber in which a substrate is processed; a gas supply unit provided in the process chamber and configured to supply a process gas that processes the substrate; a plasma generation unit provided in the process chamber and configured to activate the process gas; and a buffer part configured to form a buffer chamber accommodating at least a part of the plasma generation unit and include a gas supply hole through which the activated process gas is supplied to the substrate, wherein the buffer part includes a groove portion in which a part of the gas supply hole is cut out.

According to the present disclosure, it is possible to improve a film quality of a film to be formed.

DETAILED DESCRIPTION

First Embodiment of the Present Disclosure

Hereinafter, a first embodiment of the present disclosure will be described with reference to FIGS. 1 to 6.

(1) Configuration of Substrate Processing Apparatus (Heating Device)

Figure 1:
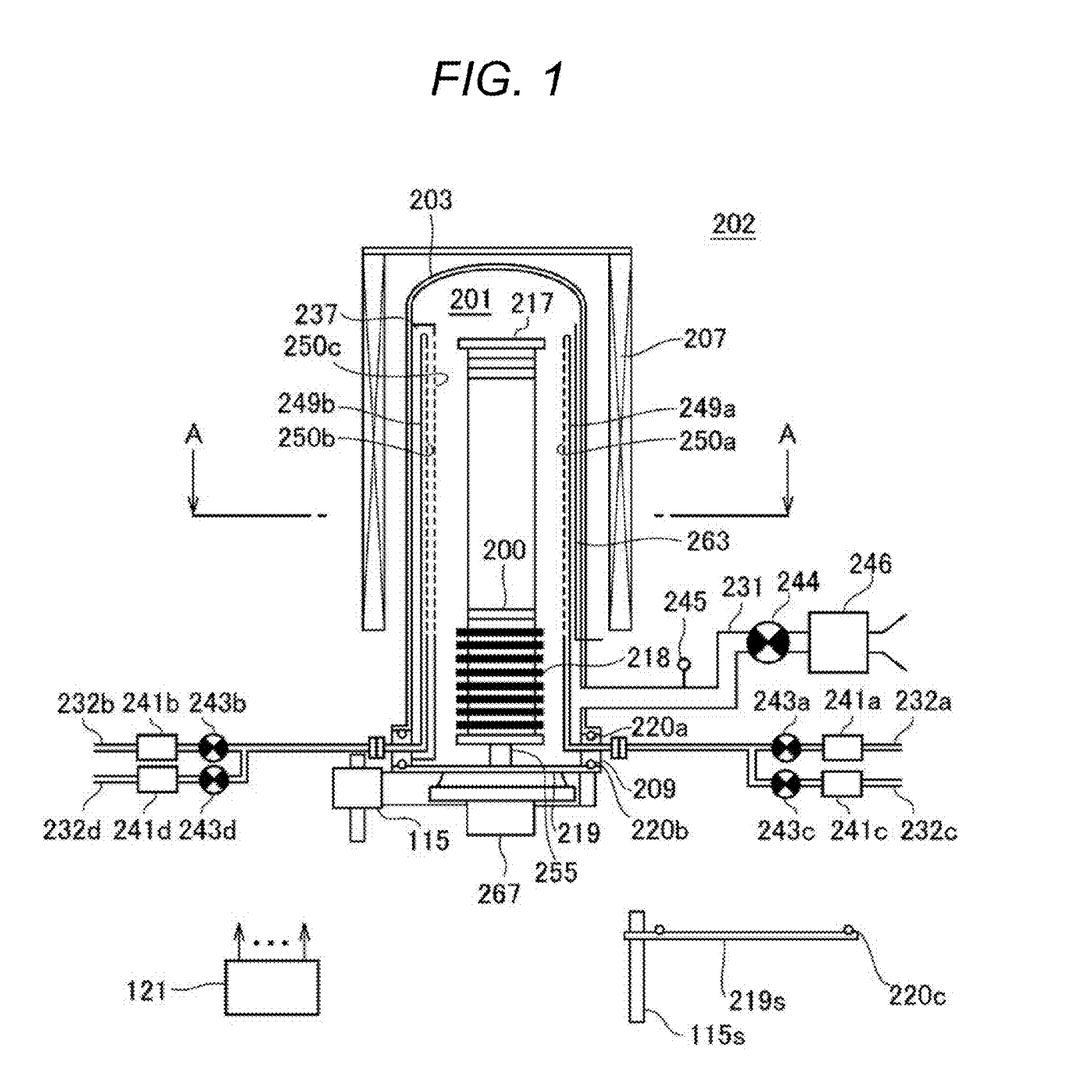
FIG. 1 is a schematic configuration diagram of a vertical process furnace of a substrate processing apparatus suitably used in an embodiment of the present disclosure and a longitudinal sectional view of a process furnace part.

As illustrated in FIG. 1, a process furnace 202 includes a heater 207 serving as a heating device (heating mechanism). The heater 207 has a cylindrical shape and is supported to a heater base (not illustrated) serving as a holding plate so that the heater 207 is vertically installed. As described below, the heater 207 functions as an activation mechanism (excitation unit) that activates (excites) a gas by heat.

(Process Chamber)

Inside the heater 207, a reaction tube 203 is disposed concentrically with the heater 207. The reaction tube 203 is made of a heat resistant material, such as quartz ($SiO_2$), silicon carbide (SiC), silicon nitride (SiN), or the like, and is formed to have a cylindrical shape with a closed upper end and an opened lower end. Under the reaction tube 203, a manifold (inlet flange) 209 is disposed concentrically with the reaction tube 203. The manifold 209 is made of a metal, such as stainless steel (SUS), and is formed to have a cylindrical shape with opened upper and lower ends. An upper part of the manifold 209 is configured to be engaged with a lower end part of the reaction tube 203 so as to support the reaction tube 203. An O-ring 220a serving as a seal member is provided between the manifold 209 and the reaction tube 203. Since the manifold 209 is supported to the heater base, the reaction tube 203 is in a state of being vertically installed. A process vessel (reaction vessel) is configured by, mainly, the reaction tube 203 and the manifold 209. A process chamber 201 is formed in a cylindrical hollow part of the process vessel. The process chamber 201 is configured such that wafers 200 as a plurality of sheets of substrates are accommodated. The process vessel is not limited to the above-described configuration, and the reaction tube 203 alone may be referred to as the process vessel.

In the process chamber 201, nozzles 249a and 249b are provided to pass through a sidewall of the manifold 209. Gas supply pipes 232a and 232b are respectively connected to the nozzles 249a and 249b. As such, the two nozzles 249a and 249b and the two gas supply pipes 232a and 232b are provided in the reaction tube 203, such that a plurality of types of gases are supplied into the process chamber 201.

Mass flow controllers (MFCs) 241a to 241b serving as flow rate controllers (flow rate control units) and valves 243a and 243b serving as open-close valves are respectively provided in the gas supply pipes 232a and 232b in this order from an upstream direction. Gas supply pipes 232c and 232d configured to supply an inert gas are respectively connected to downstream sides of the valves 243a and 243b of the gas supply pipes 232a and 232b. MFCs 241c and 241d and valves 243c and 243d are respectively provided in the gas supply pipes 232c and 232d in this order from the upstream direction.

Figure 2:
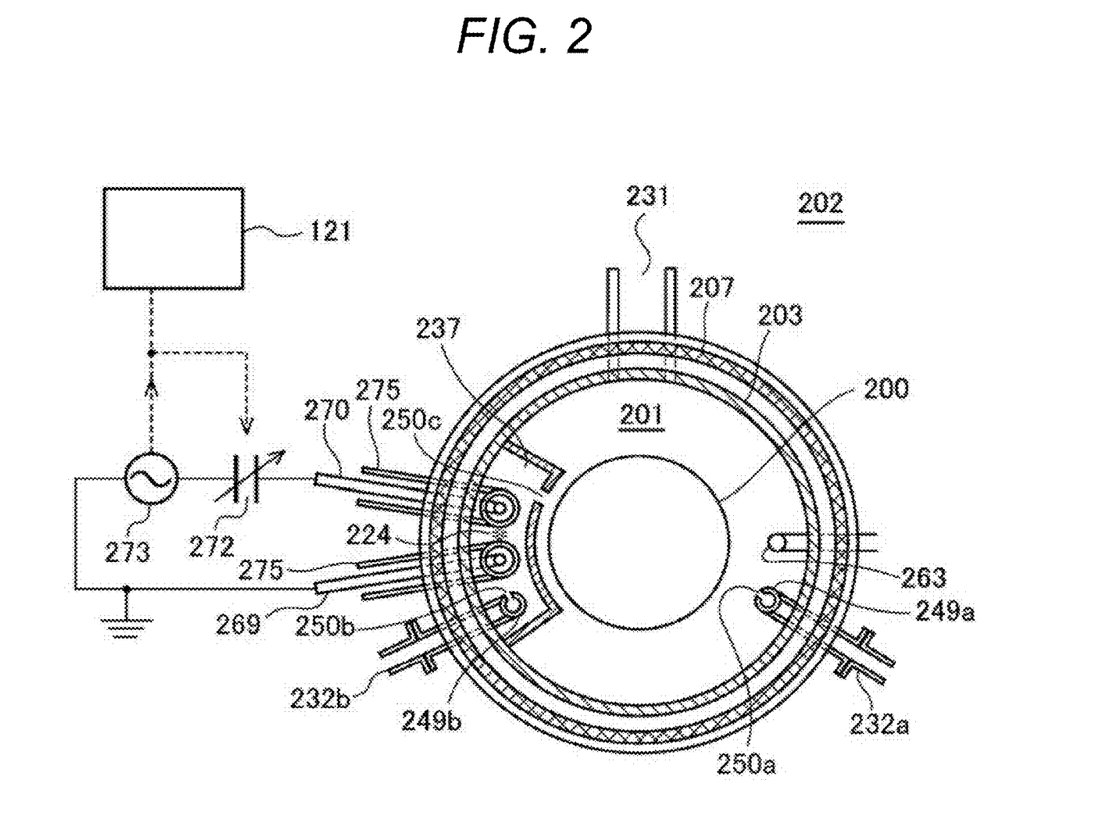
FIG. 2 is a schematic configuration diagram of the vertical process furnace of the substrate processing apparatus suitably used in the embodiment of the present disclosure and a sectional view of the process furnace part, taken along line A-A of FIG. 1.

As illustrated in FIG. 2, the nozzle 249a is provided in an annular space between an inner wall of the reaction tube 203 and the wafers 200, when seen in a plan view, so as to rise upward in a stacking direction of the wafers 200, extending from a lower part to an upper part of the inner wall of the reaction tube 203. That is, the nozzle 249a is provided in a region horizontally surrounding a wafer arrangement region, at a side of the wafer arrangement region in which the wafers 200 are arranged, so as to extend along the wafer arrangement region. In other words, the nozzle 249a is provided perpendicular to a surface (flat surface) of the wafer 200 at a side of an edge (periphery) of each wafer 200 loaded into the process chamber 201. A gas supply hole 250a configured to supply a gas is provided on a side surface of the nozzle 249a. The gas supply hole 250a is opened to face the center of the reaction tube 203, so that the gas is supplied toward the wafers 200. The gas supply hole 250a is plurally provided from the lower part to the upper part of the reaction tube 203.

The nozzle 249b is connected to a tip end part of the gas supply pipe 232b. The nozzle 249b is provided in a buffer chamber (buffer part) 237 that is a gas dispersion space. As illustrated in FIG. 2, the buffer chamber 237 is provided in the annular space between the inner wall of the reaction tube 203 and the wafers 200, when seen in a plan view, in the region from the lower part to the upper part of the inner wall of the reaction tube 203 in the stacking direction of the wafers 200. That is, the buffer chamber 237 is formed by a buffer structure (buffer part) 300 in a region horizontally surrounding the wafer arrangement region, at the side of the wafer arrangement region, so as to extend along the wafer arrangement region. The buffer structure 300 is made of an insulator such as quartz, and a gas supply hole 250c configured to supply gas is provided on a wall surface of the buffer structure 300 formed to have an arc shape. The gas supply hole 250c is opened to face the center of the reaction tube 203, so that the gas is supplied toward the wafers 200. The gas supply hole 250c is plurally provided from the lower part to the upper part of the reaction tube 203.

Figure 3:
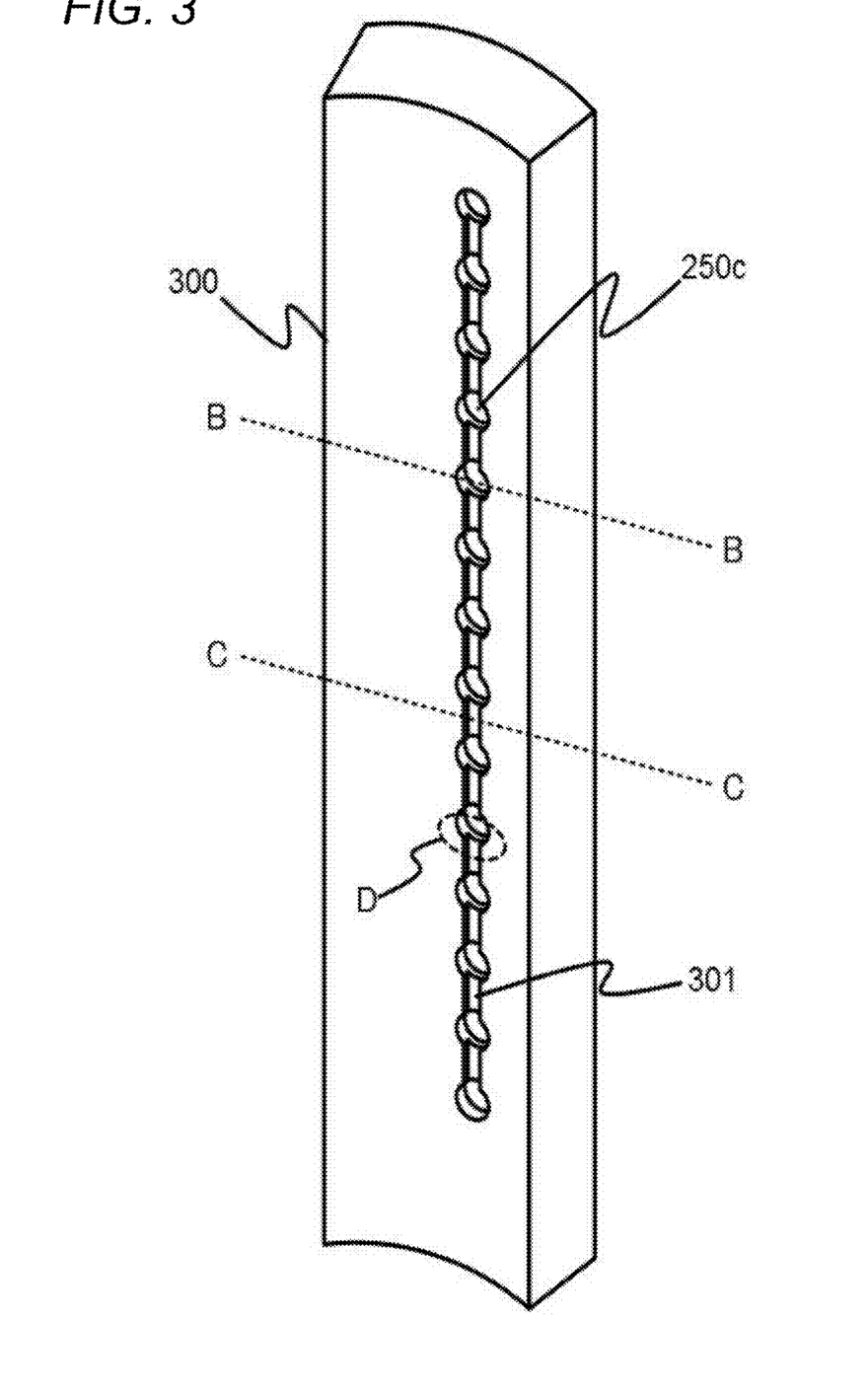
FIG. 3 is a schematic configuration diagram of a buffer structure of the substrate processing apparatus suitably used in the embodiment of the present disclosure.
Figure 4A:
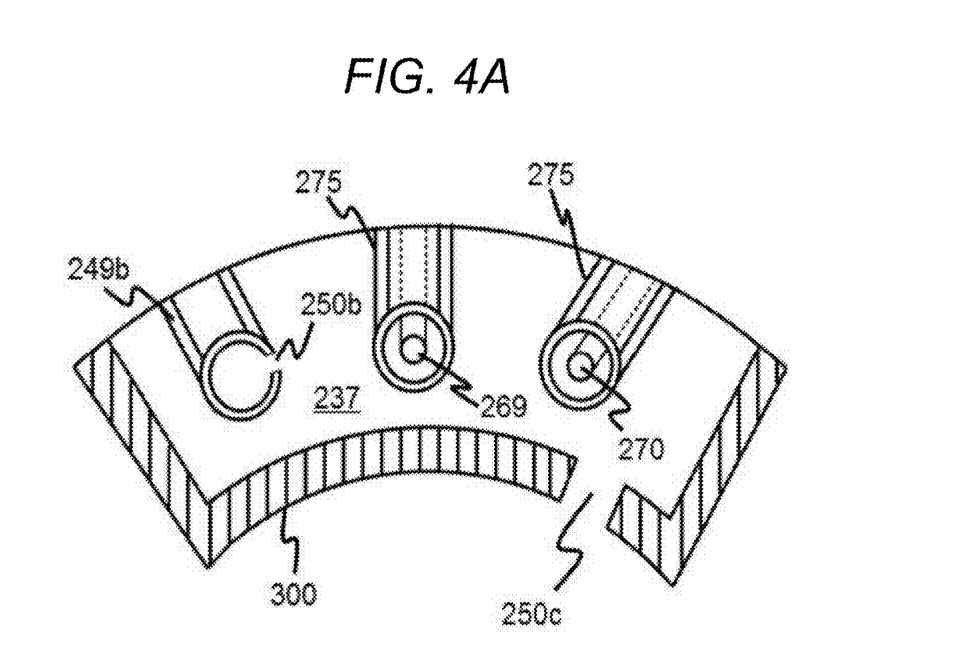
FIG. 4A is a sectional view of the buffer structure of the substrate processing apparatus suitably used in the embodiment of the present disclosure, taken along line B-B of FIG. 3.
Figure 4B:
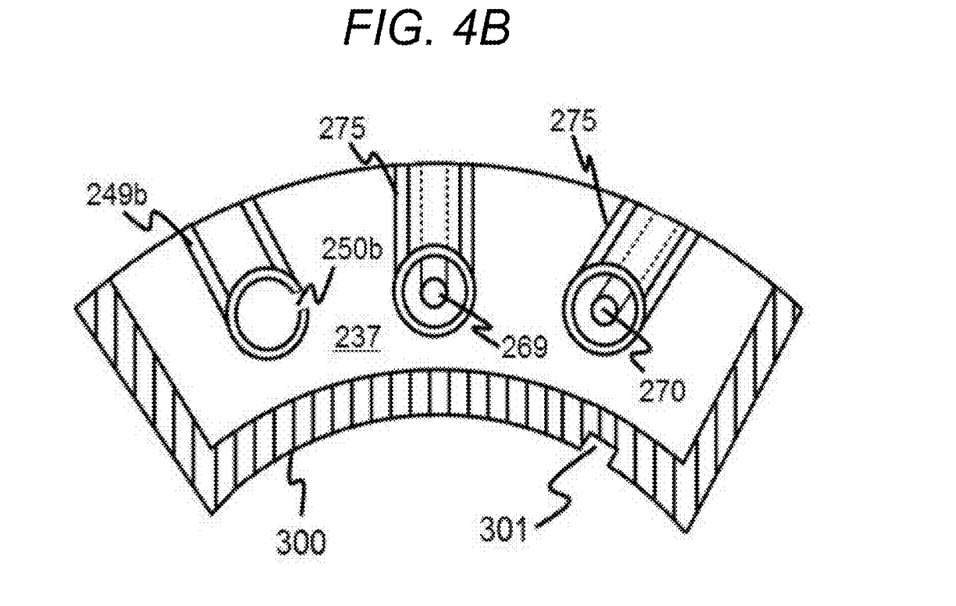
FIG. 4B is a sectional view of the buffer structure of the substrate processing apparatus suitably used in the embodiment of the present disclosure, taken along line C-C of FIG. 3.

As illustrated in FIG. 3, the buffer structure 300 is provided with a trench structure (groove portion) 301 formed so as to connect from the uppermost gas supply hole 250c to the lowermost gas supply hole 250c. The trench structure 301 is formed by cutting out a part of a wall surface of the buffer structure 300, that is, a part of the gas supply hole 250c in a vertical direction. As illustrated in FIGS. 4A and 4B, the trench structure 301 is not formed to penetrate the buffer chamber 237 like the gas supply hole 250c. That is, the trench structure 301 does not penetrate the wall surface of the buffer structure. If the trench structure is formed to penetrate the buffer chamber 237, that is, if the gas supply hole of the buffer structure is formed to have a slit shape, an active species due to plasma generated in the buffer chamber 237 in a vertical direction is hardly supplied to the wafers 200 uniformly, thus causing a reduction in inter-plane uniformity of the wafers 200.

Due to this configuration, the surface of the gas supply hole 250c is less charged up by the plasma, thereby suppressing an occurrence of abnormal electrical discharge in the gas supply hole 250c.

Figure 5:
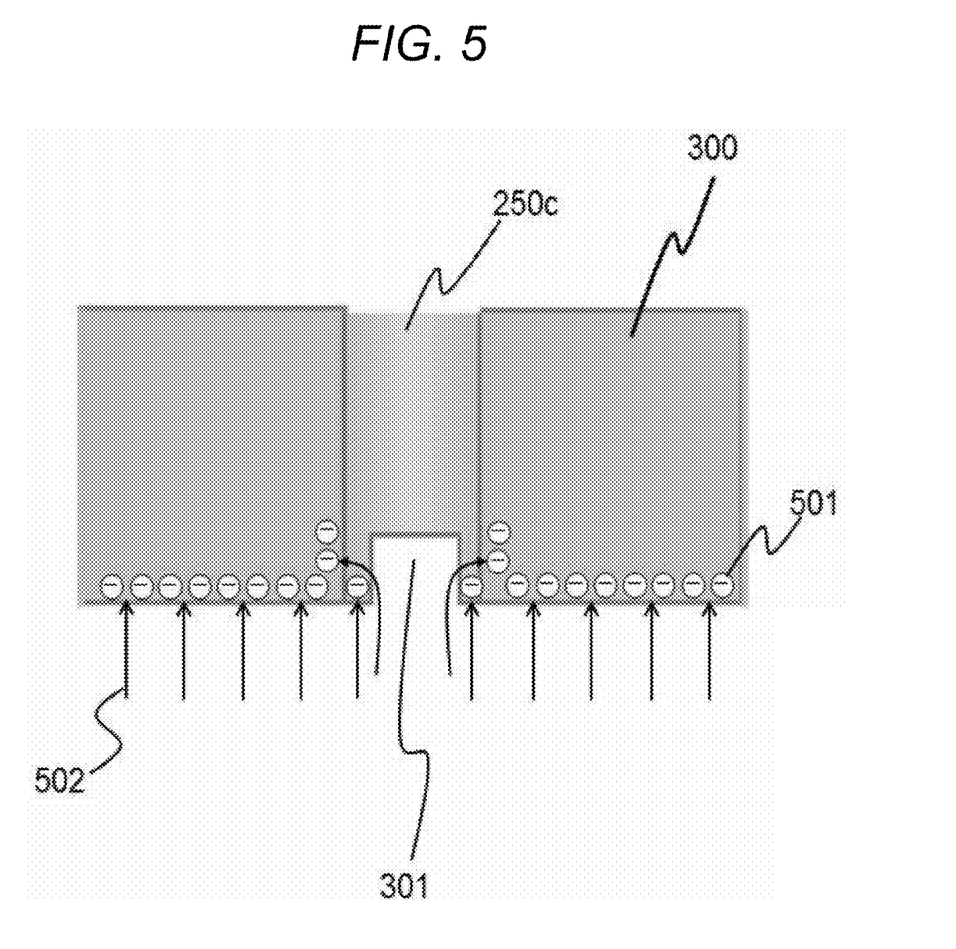
FIG. 5 is an enlarged schematic view of a region D of FIG. 3 in the buffer structure of the substrate processing apparatus suitably used in the embodiment of the present disclosure.

As illustrated in FIG. 5, the cause of the abnormal electrical discharge in the gas supply hole 250c is as follows: plasma generated in the buffer chamber by a plasma generation unit to be described below leaks toward the wafers 200, and electrons 501 are charged on the surface of the gas supply hole 250c on the wafer 200 side. In particular, when a certain amount of electrons 501 are charged on the inner wall of the gas supply hole 250c, charged particles are accelerated by an action of an electric field concentrated in the center of the gas supply hole 250c, and abnormal electrical discharge (hollow electric discharge) occurs according to a pressure in the gas supply hole 250c. In order to suppress such abnormal electrical discharge, it is necessary to reduce a charge amount charged on the inner wall of the gas supply hole 250c. The trench structure 301 makes it possible to reduce a chargeable surface area of the inner wall of the gas supply hole 250c. Here, in the trench structure 301, it is necessary to form a cut-out so that a width (short side direction) of the trench structure is less than a diameter of the gas supply hole 250c. Preferably, a width of the trench structure 301 cutting out the inner wall of the gas supply hole 250c is formed to be greater than or equal to a radius of the gas supply hole 250c and less than a diameter of the gas supply hole 250c. A case where the width of the trench structure 301 is formed to be greater than or equal to the diameter of the gas supply hole 250c has the same structure as a case where the cut-out is not provided on the inner wall of the gas supply hole 250c. Thus, it is impossible to reduce the amount charged up on the surface of the gas supply hole 250c and it is impossible to suppress abnormal electrical discharge. In addition, it is preferable that a depth of the trench structure 301 cutting out the inner wall of the gas supply hole 250c is configured to be greater than or equal to ½ of the radius of the gas supply hole 250c. If the cut-out depth of the trench structure 301 is shallower than ½ of the radius of the gas supply hole 250c, the charge amount reduction effect is too small, and thus, it is impossible to suppress abnormal electrical discharge.

The nozzle 249b is provided at the end part opposite to the end part of the buffer chamber 237 where the gas supply holes 250c are provided, so as to rise upward in the stacking direction of the wafers 200, extending from the lower part to the upper part of the inner wall of the reaction tube 203. That is, the nozzle 249b is provided in a region horizontally surrounding a wafer arrangement region, which is the inside of the buffer structure 300, at a side of the wafer arrangement region in which the wafers 200 are arranged, so as to extend along the wafer arrangement region. That is, the nozzle 249b is provided vertically to the surface of the wafer 200 at the side of the end of the wafer 200 loaded into the process chamber 201. A gas supply hole 250b configured to supply a gas is provided on a side surface of the nozzle 249b. The gas supply hole 250b is opened to face the center of the buffer chamber 237. Similarly to the gas supply holes 250c, the gas supply hole 250b is plurally provided from the lower part to the upper part of the reaction tube 203.

As such, in the present embodiment, the gas is carried through the nozzles 249a and 249b and the buffer chamber 237 disposed in the annular vertically-long space, when seen in a plan view, that is, the cylindrical space, which is defined by the inner wall of the sidewall of the reaction tube 203 and the ends of the plurality of wafers 200 arranged in the reaction tube 203. The gas is ejected from the gas supply holes 250a to 250c, which are respectively opened in the nozzles 249a and 249b and the buffer chamber 237, to the reaction tube 203 for the first time in the vicinity of the wafer 200. A main flow of the gas in the reaction tube 203 is a direction parallel to the surface of the wafer 200, that is, a horizontal direction. Due to such a configuration, it is possible to uniformly supply the gas to each of the wafers 200 and to improve the film thickness uniformity of a thin film to be formed in each of the wafers 200. A gas flowing on the surface of the wafer 200, that is, a gas remaining after reaction, flows in a direction of an exhaust port, that is, an exhaust pipe 231 to be described below. However, the direction of the flow of the remaining gas is appropriately specified according to the position of the exhaust port and is not limited to a vertical direction.

As a source containing a predetermined element, for example, a silane source gas containing silicon (Si) as a predetermined element is supplied from the gas supply pipe 232a to the process chamber 201 through the MFC 241a, the valve 243a, and the nozzle 249a.

The silane source gas is a silane source of a gaseous state, for example, a gas obtained by vaporizing a silane source that is in a liquid state under normal temperature and normal pressure, or a silane source that is in a gaseous state under normal temperature and normal pressure. A case where the term "source" is used in this disclosure is a case that means "a liquid source that is in a liquid state", a case that means a "source gas that is in a gaseous state", or a case that means both of them.

As the silane source gas, for example, a bis(tertiary-butylamino)silane ($SiH_2[NH(C_4H_9)]_2$, abbreviated to BTBAS) gas can be used. The BTBAS gas acts as a Si source.

In a case where a liquid source, such as BTBAS, which is a liquid state under normal temperature and normal pressure, is used, the source in the liquid state can be vaporized by a vaporization system, such as a vaporizer or a bubbler, and can be supplied as the silane source gas (BTBAS gas or the like).

As a reactant having a different chemical structure from the source, for example, an oxygen (O)-containing gas is supplied from the gas supply pipe 232b into the process chamber 201 through the MFC 241b, the valve 243b, and the nozzle 249b.

The O-containing gas acts as an oxidizing agent (oxidizing gas), that is, an O source. As the O-containing gas, for example, an oxygen ($O_2$) gas, water vapor ($H_2O$ gas), or the like can be used. In a case where an $O_2$ gas is used as the oxidizing agent, for example, the gas is plasma-excited by using a plasma source to be described below and is supplied as a plasma-excited gas ($O_2$*gas).

As an inert gas, for example, a nitrogen ($N_2$) gas is supplied from the gas supply pipes 232c and 232d into the process chamber 201 through the MFCs 241c and 241d, the valves 243c and 243d, the gas supply pipes 232a and 232b, and the nozzles 249a and 249b.

A source supply system as a first gas supply system is configured by, mainly, the gas supply pipe 232a, the MFC 241a, and the valve 243a. A reactant supply system as a second gas supply system is configured by, mainly, the gas supply pipe 232b, the MFC 241b, and the valve 243b. An inert gas supply system is configured by, mainly, the gas supply pipes 232c and 232d, the MFCs 241c and 241d, and the valves 243c and 243d. The source supply system, the reactant supply system, and the inert gas supply system are simply referred to as a gas supply system (gas supply unit).

(Plasma Generation Unit)

In the buffer chamber 237, as illustrated in FIG. 2, two rod-shaped electrodes 269 and 270, each of which is made of a conductor and has an elongated structure, are disposed from the lower part to the upper part of the reaction tube 203 in a stacking direction of the wafers 200. Each of the rod-shaped electrodes 269 and 270 is provided in parallel to the nozzle 249b. Each of the rod-shaped electrodes 269 and 270 is covered with and protected by an electrode protection pipe 275 from the upper part to the lower part thereof. One of the rod-shaped electrodes 269 and 270 is connected to a high frequency (RF) power source 273 through a matcher 272, and the other thereof is connected to ground which is a reference potential. By applying high frequency power from the high frequency power source 273 between the rod-shaped electrodes 269 and 270, plasma is generated in a plasma generation region 224 between the rod-shaped electrodes 269 and 270. A plasma source serving as a plasma generator (plasma generation unit) is configured by, mainly, the rod-shaped electrodes 269 and 270 and the electrode protection pipes 275. The matcher 272 and the high frequency power source 273 may be included in the plasma source. The plasma source functions as a plasma excitation unit (activation mechanism) configured to excite a gas to generate plasma, that is, to excite (activate) a gas to a plasma state as described below.

The electrode protection pipes 275 are configured such that each of the rod-shaped electrodes 269 and 270 can be inserted into the buffer chamber 237 in a state of being isolated from an atmosphere of the buffer chamber 237. When an oxygen (O) concentration in the electrode protection pipes 275 is approximately equal to an oxygen (O) concentration in the outside air (atmosphere), the rod-shaped electrodes 269 and 270 respectively inserted into the electrode protection pipes 275 are oxidized by heat generated by the heater 207. The insides of the electrode protection pipes 275 are filled with an inert gas, such as an $N_2$ gas, or are purged with an inert gas, such as an $N_2$ gas, by using an inert gas purge mechanism so that the O concentration in the electrode protection pipes 275 can be reduced to thereby prevent the oxidation of the rod-shaped electrodes 269 and 270.

(Exhaust Unit)

An exhaust pipe 231 is provided in the reaction tube 203 so as to exhaust the atmosphere of the process chamber 201. In the exhaust pipe 231, a vacuum pump 246 serving as a vacuum exhaust device is connected through a pressure sensor 245 serving as a pressure detector (pressure detection unit), which detects a pressure in the process chamber 201, and an auto pressure controller (APC) valve 244 serving as an exhaust valve (pressure regulation unit). The APC valve 244 is a valve configured to perform a vacuum exhaust or a vacuum exhaust stop with respect to the process chamber 201 by opening or closing the valve while the vacuum pump 246 is operating, and to regulate the pressure in the process chamber 201 by adjusting the degree of valve opening based on pressure information detected by the pressure sensor 245 while the vacuum pump 246 is operating. An exhaust system is configured by, mainly, the exhaust pipe 231, the APC valve 244, and the pressure sensor 245. The vacuum pump 246 may be included in the exhaust system. The exhaust pipe 231 is not limited to the installation in the reaction tube 203. Similarly to the nozzles 249a and 249b, the exhaust pipe 231 may be provided in the manifold 209.

Under the manifold 209, a seal cap 219 is provided as a furnace throat lid that can airtightly close a lower end opening of the manifold 209. The seal cap 219 is configured to abut against a lower end of the manifold 209 from a lower part in a vertical direction. The seal cap 219 is made of a metal such as stainless steel (SUS) and is formed to have a disk shape. On the top surface of the seal cap 219, an O-ring 220b is provided as a seal member that abuts against the lower end of the manifold 209. A rotation mechanism 267 that rotates a boat 217 to be described below is installed at a side of the seal cap 219 opposite to the process chamber 201. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is moved vertically upward and downward by a boat elevator 115 serving as an elevation mechanism that is vertically installed outside the reaction tube 203. The boat elevator 115 is configured to load the boat 217 into the process chamber 201 or unload the boat 217 from the process chamber 201 by moving the seal cap 219 upward or downward. The boat elevator 115 is configured as a transfer device (transfer mechanism) that transfers the boat 217, that is, the wafers 200, to the inside or the outside of the process chamber 201. In addition, under the manifold 209, a shutter 219s is provided as a furnace throat lid that can airtightly close the lower end opening of the manifold 209 while the seal cap 219 is moved downward by the boat elevator 115. The shutter 219s is made of a metal such as stainless steel (SUS) and is formed to have a disk shape. On the top surface of the shutter 219s, an O-ring 220c is provided as a seal member that abuts against the lower end of the manifold 209. The opening/closing operation (the upward/downward moving operation, the rotating operation, or the like) of the shutter 219s is controlled by a shutter opening/closing mechanism 115s.

(Substrate Support)

As illustrated in FIG. 1, the boat 217 serving as a substrate support is configured such that a plurality of sheets of wafers 200, for example, 25 to 200 wafers, are vertically aligned and supported in a horizontal posture, with their centers aligned with one another, in multiple stages, that is, arranged spaced apart from one another at predetermined intervals. The boat 217 is made of, for example, a heat resistant material such as quartz or SiC. Under the boat 217, a heat insulation plate 218, which is made of, for example, a heat resistant material such as quartz or SiC, is configured to be supported in multiple stages.

As illustrated in FIG. 2, a temperature sensor 263 serving as a temperature detector is installed in the reaction tube 203. An amount of current to be supplied to the heater 207 is adjusted based on temperature information detected by the temperature sensor 263, so that the temperature in the process chamber 201 has a desired temperature distribution. Similarly to the nozzles 249a and 249b, the temperature sensor 263 is provided along the inner wall of the reaction tube 203.

(Control Device)

Figure 6:
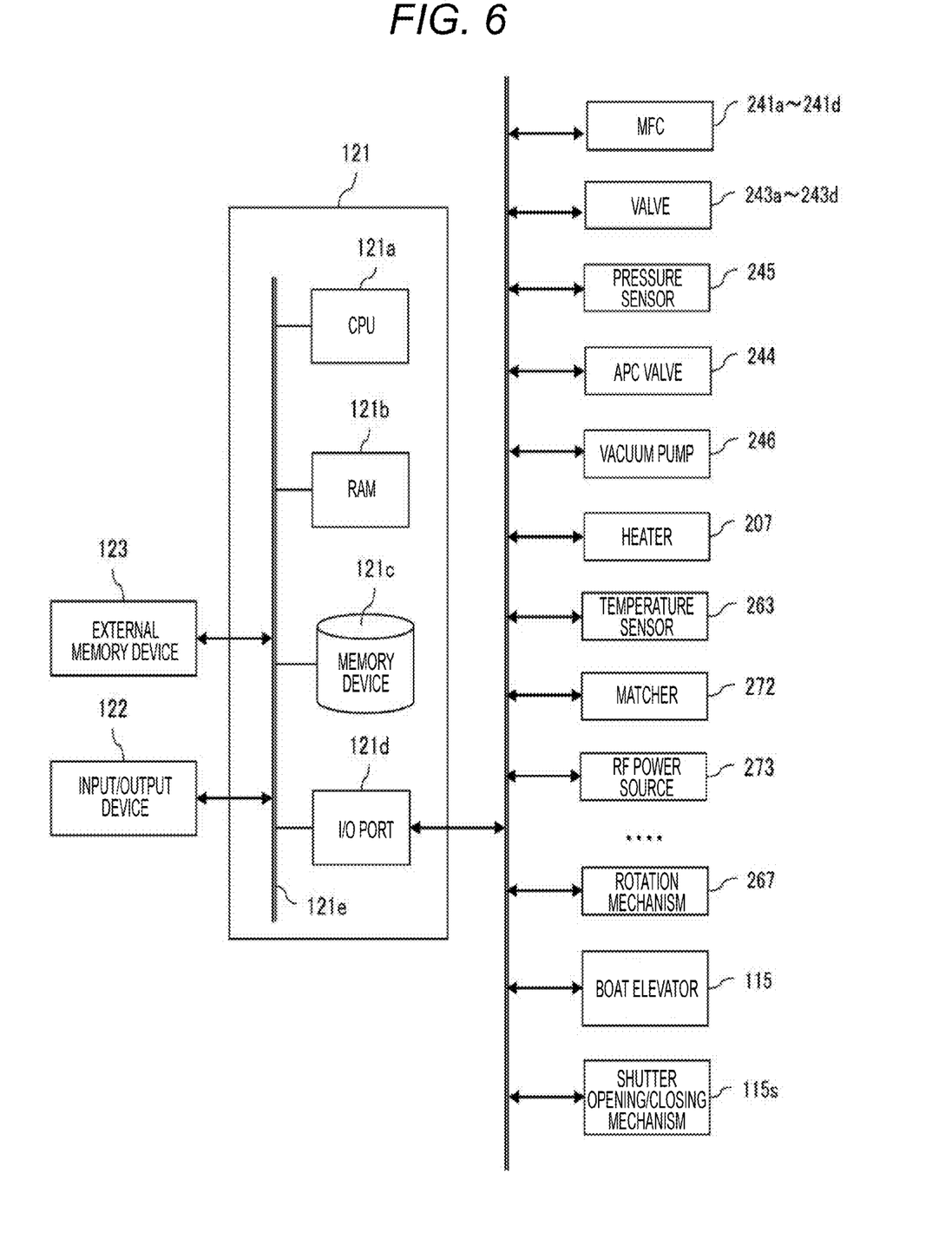
FIG. 6 is a schematic configuration diagram of a controller of the substrate processing apparatus suitably used in the embodiment of the present disclosure and a block diagram of a control system of the controller.

Next, a control device will be described with reference to FIG. 6. As illustrated in FIG. 6, a controller 121 being a control unit (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe describing procedures or conditions of a film-forming process to be described below is stored to be readable. The process recipe is a combination of procedures of various processes (film-forming process) to be described below so as to obtain a desired result when the processes are performed by the controller 121, and functions as a program. Hereinafter, the process recipe, the control program, and the like will be simply and collectively referred to as a program. In addition, the process recipe is simply referred to as a recipe. When the term "program" is used in the present disclosure, it may be understood as including only a recipe alone, only a control program alone, or both of the recipe and the control program. The RAM 121b is configured as a memory area (work area) in which a program or data read by the CPU 121a is temporarily retained.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like.

The CPU 121a is configured to read and execute the control program from the memory device 121c and to read the recipe from the memory device 121c according to an input of an operation command from the I/O device 122, or the like. According to the contents of the read recipe, the CPU 121a is configured to control the operation of controlling the rotation mechanism 267, the operation of adjusting the flow rates of various gases by the MFCs 241a to 241d, the operation of opening and closing the valves 243a to 243d, the operation of adjusting the pressure by the APC valve 244 based on the pressure sensor 245 and the operation of opening and closing the APC valve 244, the start and stop of the vacuum pump 246, the operation of adjusting the temperature of the heater 207 based on the temperature sensor 263, the operation of adjusting the forward and backward rotation, the rotation angle, and the rotating speed of the boat 217 by the rotation mechanism 267, and the operation of moving the boat 217 upward and downward by the boat elevator 115.

The controller 121 can be configured by installing, on a computer, the program stored in an external memory device (for example, a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 may also be simply and collectively referred to as a recording medium. When the term "recording medium" is used in the present disclosure, it may be understood as including only the memory device 121c alone, only the external memory device 123 alone, or both of the memory device 121c and the external memory device 123. The provision of the program to the computer may be performed by using a communication unit, such as the Internet, dedicated lines, or the like, without using the external memory device 123.

(2) Substrate Processing Process

Figure 7:
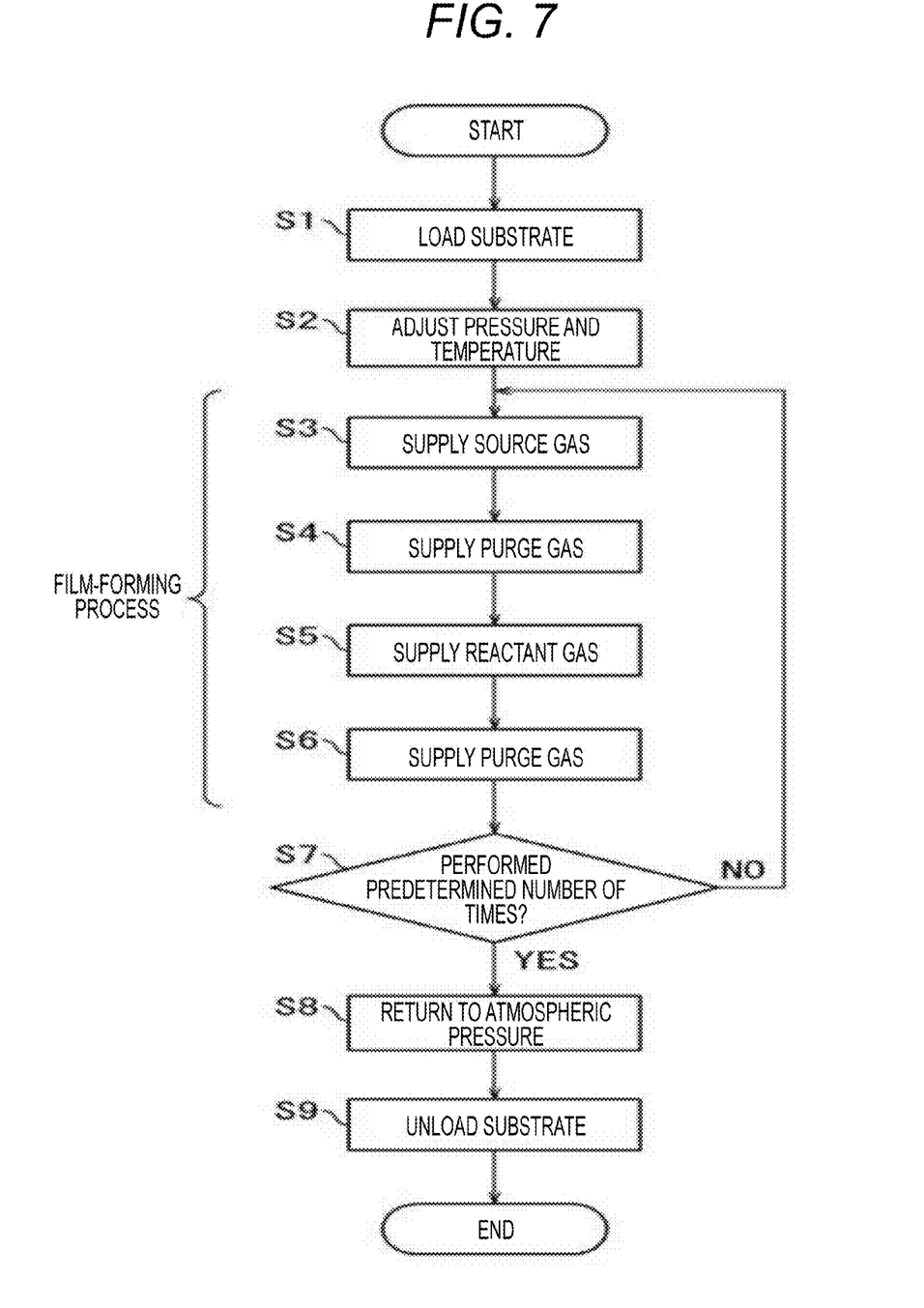
FIG. 7 is a diagram illustrating a flow of a substrate processing process according to an embodiment of the present disclosure.

Next, as one of the processes of manufacturing a semiconductor device, a process of forming a thin film on a wafer 200 by using the substrate processing apparatus 100 will be described with reference to FIG. 7. In the following description, operations of the respective elements constituting the substrate processing apparatus are controlled by the controller 121.

The following description will be given of an example of forming a silicon oxide film (SiO film) as a film including Si and O on a wafer 200 by performing supplying a BTBAS gas as a source gas and supplying a plasma-excited $O_2$ gas as a reactant gas non-simultaneously, that is, without synchronization, a predetermined number of times (once or more). In addition, for example, a predetermined film may be formed in advance on the wafer 200. In addition, a predetermined pattern may be formed in advance on the wafer 200 or the predetermined film.

In the present disclosure, for convenience, the process flow of the film-forming process illustrated in FIG. 7 may be represented as follows. In the following descriptions of modification examples or other embodiments, the same notation is used.

$(BTBAS \to O_2^*) \times n \to SiO$

When the term "wafer" is used in the present disclosure, it may be understood as "a wafer itself" or "a laminate (aggregate) of a wafer and a predetermined layer or film formed on a surface thereof", that is, a wafer including a predetermined layer or film formed on a surface thereof. In addition, when the expression "a surface of a wafer" is used in the present disclosure, it may be understood as "a surface (exposed surface) of a wafer itself" or "a surface of a predetermined layer or film formed on a wafer, that is, an uppermost surface of a wafer as a laminate".

Thus, in the present disclosure, the expression "a predetermined gas is supplied to a wafer" may be understood to mean that "the predetermined gas is directly supplied to a surface (exposed surface) of a wafer itself" or mean that "the predetermined gas is supplied to a layer or film formed on a wafer, that is, an uppermost surface of a wafer as a laminate". In addition, in the present disclosure, the expression "a predetermined layer (or film) is formed on a wafer" may be understood to mean that "a predetermined layer (or film) is directly formed on a surface (exposed surface) of a wafer itself" or mean that "a predetermined layer (or film) is formed on a layer or film formed on a wafer, that is, an uppermost surface of a wafer as a laminate".

In addition, a case where the term "substrate" is used in the present disclosure is the same as the case where the term "wafer" is used.

(Loading Step: S1)

When a plurality of sheets of wafers 200 are charged into the boat 217 (wafer charging), the shutter 219s is moved by the shutter opening/closing mechanism 115s and the lower end opening of the manifold 209 is opened (shutter opening). After that, as illustrated in FIG. 1, the boat 217 that supports the plurality of sheets of wafers 200 is lifted by the boat elevator 115 and is loaded into the process chamber 201 (boat loading). In this state, the seal cap 219 is in a state of sealing the lower end of the manifold 209 through the O-ring 220b.

(Pressure and Temperature Adjusting Step: S2)

The inside of the process chamber 201, that is, the space where the wafers 200 are present, is vacuum-exhausted (exhausted under reduced pressure) to have a desired pressure (degree of vacuum) by the vacuum pump 246. In this case, the pressure in the process chamber 201 is measured by the pressure sensor 245, and the APC valve 244 is feedback-controlled based on information about the measured pressure. The vacuum pump 246 maintains a full-time operating state at least until the completion of a film-forming step to be described below.

In addition, the wafers 200 in the process chamber 201 are heated by the heater 207 until the wafers 200 have a desired temperature. In this case, an amount of current supplied to the heater 207 is feedback-controlled based on the temperature information detected by the temperature sensor 263, so that the inside of the process chamber 201 has a desired temperature distribution. The heating of the inside of the process chamber 201 by the heater 207 is continuously performed at least until the completion of the film-forming step to be described below. However, in a case where the film-forming step is performed under a temperature condition of room temperature or less, it may be unnecessary to heat the inside of the process chamber 201 by the heater 207. Incidentally, in a case where only the processing under such temperature is performed, the heater 207 is unnecessary and the heater 207 may not need to be installed in the substrate processing apparatus. In this case, the configuration of the substrate processing apparatus can be simplified.

Subsequently, the rotation of the boat 217 and the wafers 200 is started by the rotation mechanism 267. The rotation of the boat 217 and the wafers 200 by the rotation mechanism 267 is continuously performed at least until the completion of the film-forming step.

(Film-Forming Step: S3, S4, S5, and S6)

After that, a film-forming step is performed by sequentially performing steps S3, S4, S5, and S6.

(Source Gas Supplying Step: S3 and S4)

In step S3, a BTBAS gas is supplied to the wafers 200 in the process chamber 201.

The valve 243a is opened so that the BTBAS gas flows into the gas supply pipe 232a. The flow rate of the BTBAS gas is adjusted by the MFC 241a, and the BTBAS gas is supplied from the gas supply hole 250a to the process chamber 201 through the nozzle 249a and is exhausted from the exhaust pipe 231. At this time, the valve 243c is opened at the same time, and an $N_2$ gas flows into the gas supply pipe 232c. The flow rate of the $N_2$ gas is adjusted by the MFC 241c, and the $N_2$ gas is supplied to the process chamber 201 together with the BTBAS gas and is exhausted from the exhaust pipe 231.

In addition, in order to suppress the intrusion of the BTBAS gas into the nozzle 249b, the valve 243d is opened so that the $N_2$ gas flows into the gas supply pipe 232d. The $N_2$ gas is supplied to the process chamber 201 through the gas supply pipe 232b and the nozzle 249b and is exhausted from the exhaust pipe 231.

The supply flow rate of the BTBAS gas, which is controlled by the MFC 241a, is set to be a flow rate within a range of, for example, 1 sccm to 2,000 sccm, and preferably 10 sccm to 1,000 sccm. The supply flow rates of the $N_2$ gases, which are controlled by the MFCs 241c and 241d, are respectively set to be a flow rate within a range of, for example, 100 sccm to 10,000 sccm. The pressure in the process chamber 201 is set to be a pressure within a range of, for example, 1 Pa to 2,666 Pa, and preferably 67 Pa to 1,333 Pa. The time to expose the wafers 200 to the BTBAS gas is set to be a time within a range of, for example, 1 second to 100 seconds, and preferably 1 second to 50 seconds.

The temperature of the heater 207 is set such that the temperature of the wafers 200 is set to be a temperature within a range of, for example, 0° C. to 150° C., preferably room temperature (25° C.) to 100° C., and more preferably 40° C. to 90° C. The BTBAS gas is a highly reactive gas that is easily adsorbed on the wafer 200 or the like. Therefore, even at a low temperature of, for example, about room temperature, the BTBAS gas can be chemically adsorbed on the wafer 200 and a practical deposition rate can be obtained. As in the present embodiment, by setting the temperature of the wafer 200 to 150° C. or less, further 100° C. or less, and even further 90° C. or less, it is possible to reduce an amount of heat applied to the wafer 200 and to satisfactorily perform the control of heat history experienced by the wafer 200. In addition, when the temperature of the wafer 200 is 0° C. or more, the BTBAS can be sufficiently adsorbed on the wafer 200, and thus, a sufficient deposition rate can be obtained. Therefore, it is suitable that the temperature of the wafer 200 is set to be a temperature within a range of 0° C. to 150° C., preferably 100° C. or less, and more preferably 40° C. to 90° C.

By supplying the BTBAS gas to the wafer 200 under the above-described condition, a Si-containing layer is formed on the wafer 200 (base film of the surface of the wafer 200) to a thickness of, for example, less than one atomic layer (one molecular layer) to several atomic layers (several molecular layers). The Si-containing layer may be a Si layer or a BTBAS adsorption layer, and may include both of them.

The Si layer is a generic term including not only a continuous layer configured by Si but also a discontinuous layer or a Si thin film formed by overlapping these layers. Si constituting the Si layer includes those whose bond with an amino group is not completely cut and those whose bond with H is not completely cut.

The BTBAS adsorption layer includes not only a continuous adsorption layer configured by BTBAS molecules but also a discontinuous adsorption layer. The BTBAS molecules constituting the BTBAS adsorption layer include those whose bond with Si and the amino group is partially cut, those whose bond with Si and H is partially cut, those whose bond with N and C is partially cut, and the like. That is, the BTBAS adsorption layer may be a physical BTBAS adsorption layer, may be a chemical BTBAS adsorption layer, or may include both of them.

Here, the layer having the thickness of less than one atomic layer (one molecular layer) means an atomic layer (molecular layer) that is discontinuously formed, and the layer having the thickness of one atomic layer (one molecular layer) means an atomic layer (molecular layer) that is continuously formed. The Si-containing layer may include both the Si layer and the BTBAS adsorption layer. However, as described above, the expression "one atomic layer", "several atomic layers", or the like in the Si-containing layer is used, and "atomic layer" is used synonymously with "molecular layer".

Under a condition that the BTBAS is self-decomposed (thermally decomposed), that is, under a condition that a thermal decomposition reaction of the BTBAS occurs, Si is deposited on the wafer 200 to form a Si layer. Under a condition that the BTBAS is not self-decomposed (thermally decomposed), that is, under a condition that a thermal decomposition reaction of the BTBAS does not occur, BTBAS is adsorbed on the wafer 200 to form a BTBAS adsorption layer. However, in the present embodiment, since the temperature of the wafer 200 is set to be a low temperature of, for example, 150° C. or less, the thermal decomposition of the BTBAS hardly occur. As a result, the BTBAS adsorption layer rather than the Si layer is easily formed on the wafer 200.

When the thickness of the Si-containing layer formed on the wafer 200 exceeds the several atomic layers, a modification action in a modification process to be described below does not reach the entire Si-containing layer. In addition, a minimum value of the thickness of the Si-containing layer, which can be formed on the wafer 200, is less than one atomic layer. Therefore, it is preferable that the thickness of the Si-containing layer is set to be less than one atomic layer to several atomic layers. When the thickness of the Si-containing layer is set to be one atomic layer or less, that is, one atomic layer or less than one atomic layer, the modification action in the modification process to be described below can be relatively increased, and the time necessary for a modification reaction in the modification process can be reduced. The time necessary for forming the Si-containing layer in the modification process can be reduced. As a result, the processing time per a cycle can be reduced and the total processing time can be reduced. That is, the deposition rate can be increased. In addition, when the thickness of the Si-containing layer is set to be one atomic layer or less, the controllability of the film thickness uniformity can be increased.

After the Si-containing layer is formed, the valve 243a is closed and the supply of the BTBAS gas into the process chamber 201 is stopped. At this time, the APC valve 244 is maintained in the opened state, and the inside of the process chamber 201 is vacuum-exhausted by the vacuum pump 246. The unreacted BTBAS gas remaining in the process chamber 201, the BTBAS gas remaining after contributing to the formation of the Si-containing layer, the reaction by-product, and the like are exhausted from the process chamber 201 (S4). In addition, the valves 243c and 243d are maintained in the opened state, and the supply of the $N_2$ gas into the process chamber 201 is maintained. The $N_2$ gas acts as a purge gas. Incidentally, this step S4 may be omitted.

As the source gas, in addition to the BTBAS gas, a tetrakis(dimethyl)aminosilane ($Si[N(CH_3)_2]_4$, abbreviated to 4DMAS) gas, a tris(dimethylamino)silane ($Si[N(CH_3)_2]_3H$, abbreviated to 3DMAS) gas, a bis(dimethylamino)silane ($Si[N(CH_3)_2]_2H_2$, abbreviated to BDMAS) gas, a bis(diethylamino) silane ($Si[N(C_2H_5)_2]_2H_2$, abbreviated to BDEAS) gas, or the like can be suitably used. Moreover, as the source gas, various aminosilane source gases, such as a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, a hexamethyldisilazane (HMDS) gas, or the like, inorganic halosilane source gases, such as a monochlorosilane ($SiH_3Cl$, abbreviated to MCS) gas, a dichlorosilane ($SiH_2Cl_2$, abbreviated to DCS) gas, a trichlorosilane ($SiHCl_3$, abbreviated to TCS) gas, a tetrachlorosilane or silicon tetrachloride ($SiCl_4$, abbreviated to STC) gas, a hexachlorodisilane ($Si_2Cl_6$, abbreviated to HCDS) gas, an octachlorotrisilane ($Si_3Cl_8$, abbreviated to OCTS) gas, or the like, and halogen group-free inorganic silane source gases, such as a monosilane ($SiH_4$, abbreviated to MS) gas, a disilane ($Si_2H_6$, abbreviated to DS) gas, a trisilane ($Si_3H_8$, abbreviated to TS) gas, or the like can be suitably used.

In addition to the $N_2$ gas, a rare gas, such as an Ar gas, a He gas, a Ne gas, a Xe gas, or the like can also be used as the inert gas.

(Reactant Gas Supplying Step: S5 and S6)

After the film-forming process is completed, a plasma-excited $O_2$ gas as a reactant gas is supplied to the wafer 200 in the process chamber 201 (S5).

In this step, the opening/closing control of the valves 243b to 243d is performed in the same procedures as the opening/closing control of the valves 243a, 243c, and 243d in step S3. The $O_2$ gas, the flow rate of which is adjusted by the MFC 241b, is supplied to the buffer chamber 237 through the nozzle 249b. At this time, high frequency power is supplied between the rod-shaped electrodes 269 and 270. The $O_2$ gas supplied to the buffer chamber 237 is excited to a plasma state, is supplied to the process chamber 201 as an active species (O*), and is exhausted from the exhaust pipe 231. The $O_2$ gas excited to the plasma state is also referred to as oxygen plasma.

The supply flow rate of the $O_2$ gas, which is controlled by the MFC 241b, is set to be a flow rate in a range within, for example, 100 sccm to 10,000 sccm. The high frequency power, which is applied to the rod-shaped electrodes 269 and 270, is set to be power in a range within, for example, 50 W to 1,000 W. The pressure in the process chamber 201 is set to be a pressure within a range of, for example, 1 Pa to 100 Pa. A partial pressure of the $O_2$ gas in the process chamber 201 is set to be a pressure within a range of, for example, 0.01 Pa to 100 Pa. Due to the use of the plasma, the $O_2$ gas can be activated even when the pressure in the process chamber 201 is set to be such a relatively low pressure zone. The time to supply the active species, which is obtained by plasma-exciting the $O_2$ gas, to the wafer 200, that is, the gas supply time (irradiation time), is set to be a time within a range of, for example, 1 second to 120 seconds, and preferably 1 second to 60 seconds. The other process conditions are the same as the process conditions in S3.

By supplying the $O_2$ gas to the wafer 200 under the above-described condition, the Si-containing layer formed on the wafer 200 is plasma-oxidized. At this time, due to the energy of the plasma-excited $O_2$ gas, a Si—N bond and a Si—H bond included in the Si-containing layer are broken. N and H separated from the bond with Si and C bonded to N are desorbed from the Si-containing layer. Si of the Si-containing layer that has a dangling bond due to the desorption of N or the like is bonded to O included in the $O_2$ gas, and the Si—O bond is formed. Due to the progress of this reaction, the Si-containing layer is changed (modified) into a layer including Si and O, that is, a silicon oxide layer (SiO layer).

In order to modify the Si-containing layer into the SiO layer, it is necessary to plasma-excite the $O_2$ gas and supply the plasma-excited $O_2$ gas. This is because, in the above-described temperature zone, even if the $O_2$ gas is supplied under non-plasma atmosphere, energy necessary for oxidizing the Si-containing layer is insufficient and it is difficult to increase a Si—O bond by sufficiently desorbing N or C from the Si-containing layer or sufficiently oxidizing the Si-containing layer.

After the Si-containing layer is changed to the SiO layer, the valve 243b is closed to stop the supply of the $O_2$ gas. In addition, the supply of the high frequency power between the rod-shaped electrodes 269 and 270 is stopped. Then, the $O_2$ gas or the reaction by-product remaining in the process chamber 201 is removed from the process chamber 201 according to the same process procedures and process conditions as those in step S4 (S6). Incidentally, this step S6 may be omitted.

In addition to the $O_2$ gas, a nitrous oxide ($N_2O$) gas, a nitrogen monoxide (NO) gas, a nitrogen dioxide ($NO_2$) gas, an ozone ($O_3$) gas, a hydrogen peroxide ($H_2O_2$) gas, water vapor ($H_2O$) gas, a carbon monoxide (CO) gas, or a carbon dioxide ($CO_2$) gas can be used as the plasma-excited O-containing gas.

In addition to the $N_2$ gas, for example, various rare gases exemplified in step S4 can be used as the inert gas.

(Performing Predetermined Number of Times: S7)

A SiO film having a predetermined composition and a predetermined film thickness can be formed on the wafer 200 by performing a cycle a predetermined number of times (n times), that is, once or more (S7), the cycle including non-simultaneously performing the above-described S3, S4, S5, and S6 in this order, that is, without synchronization. The above-described cycle is preferably performed twice or more. That is, the thickness of the SiO layer to be formed per a cycle may be set to be less than a desired film thickness and the above-described cycle may be performed twice or more until the film thickness of the SiO film formed by laminating the SiO layers becomes a desired film thickness.

(Atmospheric Pressure Returning Step: S8)

When the above-described film-forming process is completed, an $N_2$ gas as an inert gas is supplied from each of the gas supply pipes 232c and 232d to the process chamber 201 and is exhausted from the exhaust pipe 231. Therefore, the inside of the process chamber 201 is purged with the inert gas, and the $O_2$ gas or the like remaining in the process chamber 201 is removed from the process chamber 201 (inert gas purging). After that, the atmosphere in the process chamber 201 is replaced with the inert gas (inert gas replacement) and the pressure in the process chamber 201 is returned to the atmospheric pressure (S8).

(Unloading Step: S9)

After that, the seal cap 219 is moved downward by the boat elevator 115. Thus, the lower end of the manifold 209 is opened and the boat 217 is unloaded from the lower end of the manifold 209 to the outside of the reaction tube 203 in a state in which the processed wafers 200 are supported to the boat 217 (boat unloading) (S9). After the boat unloading, the shutter 219s is moved and the lower end opening of the manifold 209 is sealed through the O-ring 220c by the shutter 219s (shutter closing). The processed wafers 200 are unloaded to the outside of the reaction tube 203 and are discharged from the boat 217 (wafer discharging). Incidentally, after the wafer discharging, the empty boat 217 may be loaded into the process chamber 201.

(3) Effects of the Present Embodiment

According to the present embodiment, one or more effects described below can be obtained. (a) Since the trench structure 301 is formed in the gas supply hole 250c of the buffer structure 300, it is possible to suppress the charging of electrons on the surface of the gas supply hole 250c and to suppress the occurrence of abnormal electrical discharge from the gas supply hole 250c. (b) Since the trench structure 301 does not penetrate the buffer chamber 237, it is possible to maintain the strength of the buffer structure 300 and to uniformly supply the active species onto a plurality of wafers 200 held in multiple stages in a vertical direction. (c) Since the trench structure is provided, it is possible to suppress abnormal electrical discharge through a simple structure and to suppress an increase in costs.

Modification Example 1

Figure 8:
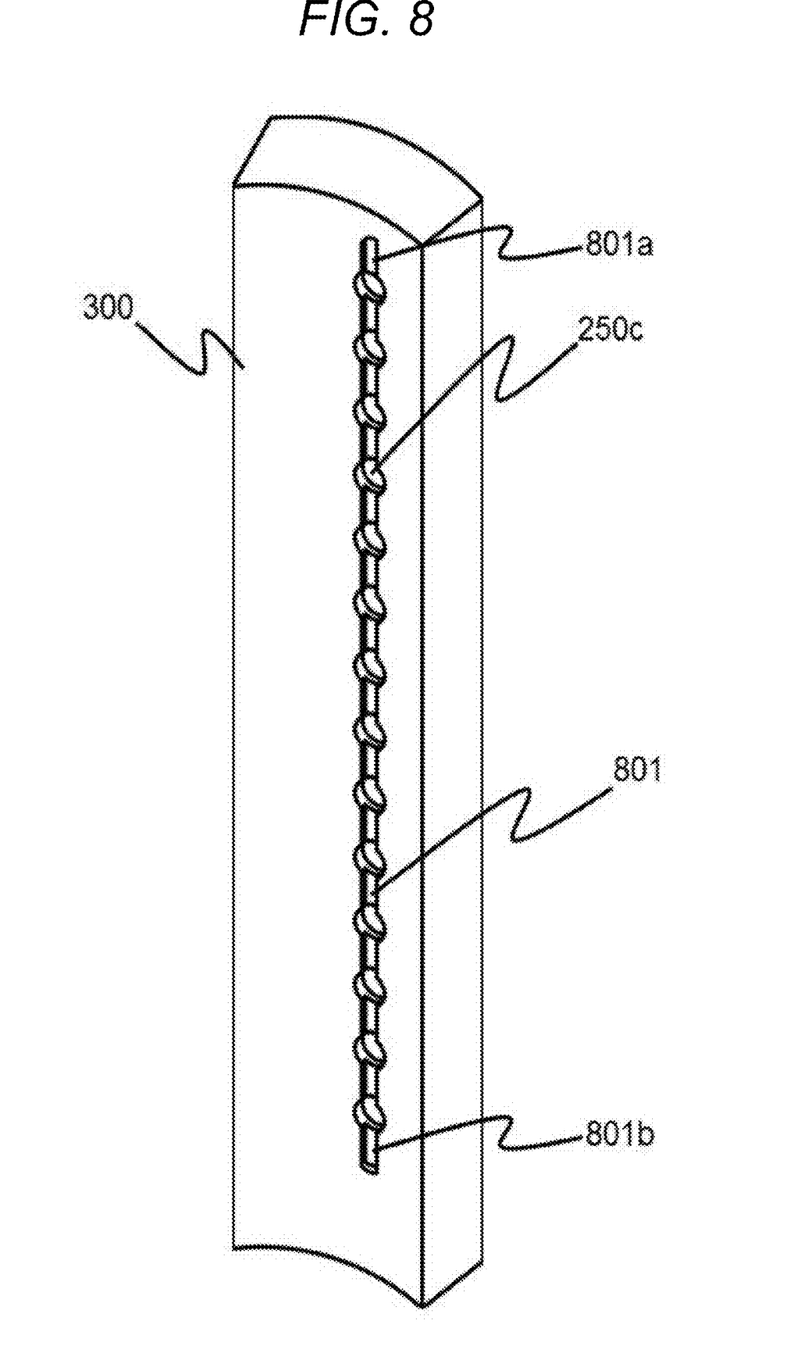
FIG. 8 is a diagram illustrating a modification example of a first embodiment of the present disclosure.

Next, a modification example of the present disclosure will be described with reference to FIG. 8. In the first embodiment, the trench structure is not formed above the uppermost gas supply hole 250c and below the lowermost gas supply hole 250c; however, in the present modification example, a trench structure 801a is formed above the uppermost gas supply hole 250c and a trench structure 801b is formed below the lowermost gas supply hole 250c. Due to such a configuration, the cut-out is formed even in the uppermost and lowermost gas supply holes 250c, like the gas supply holes 250c formed at other positions. Therefore, it is possible to suppress the charging on the surfaces of the gas supply holes 250c and to further improve uniformity between the surfaces of the wafers 200.

The embodiments of the present disclosure have been described in detail. However, the present disclosure is not limited to the above-described embodiments, and various modifications can be made thereto without departing from the scope of the present disclosure.

For example, in the embodiments and the modification example described above, the trench shape formed in the buffer structure 300 is formed to connect the gas supply holes 250c in the vertical direction. However, the present disclosure is not limited to these embodiments. The trench structure may be formed in each of the gas supply holes 250c, without connecting the gas supply holes 250c to each other, and the trench structure may be formed in the horizontal direction or the oblique direction, instead of the vertical direction. In a case where the trench structure is formed in each of the gas supply holes 250c, it is preferable that the long side direction of the trench structure is formed to be twice or more the square root of 2 with respect to the radius of the gas supply hole.

In addition, for example, in the above-described embodiment, the example of supplying the reactant after the supply of the source has been described. However, the present disclosure is not limited to this embodiment, the supply order of the source and the reactant may be reversed. That is, the source may be supplied after the reactant is supplied. By changing the supply order, it is possible to change the film quality or the composition ratio of the film to be formed.

In the above-described embodiments, the example of forming the SiO film on the wafer 200 has been described. The present disclosure is not limited to this embodiment. The present disclosure can also be suitably applied to a case where a Si-based oxide film, such as a silicon oxycarbide film (SiOC film), a silicon oxycarbonitride film (SiOCN film), a silicon oxynitride film (SiON film), or the like is formed on the wafer 200, or a case where a Si-based nitride film, such as a silicon nitride film (SiN film), a silicon carbonitride film (SiCN film), a silicon boron nitride film (SiBN film), a silicon boron carbonitride film (SiBCN film), a boron carbonitride film (BCN film), or the like, is formed on the wafer 200. In these cases, in addition to the O-containing gas, a C-containing gas such as $C_3H_6$, an N-containing gas such as $NH_3$, and a B-containing gas such as $BCl_3$ can be used as the reactant gas.

In addition, the present disclosure can be suitably applied to the case of forming, on the wafer 200, a metal-based oxide film or a metal-based nitride film, that is, an oxide film or a nitride film including a metal element such as titanium (Ti), zirconium (Zr), hafnium (Hf), tantalum (Ta), niobium (Nb), aluminum (Al), molybdenum (Mo), or tungsten (W). That is, the present disclosure can also be suitably applied to the case of forming, on the wafer 200, a TiO film, a TiN film, a TiOC film, a TiOCN film, a TiON film, a TiBN film, a TiBCN film, a ZrO film, a ZrN film, a ZrOC film, a ZrOCN film, a ZrON film, a ZrBN film, a ZrBCN film, a HfO film, a HfN film, a HfOC film, a HfOCN film, a HfON film, a HfBN film, a HfBCN film, a TaO film, a TaOC film, a TaOCN film, a TaON film, a TaBN film, a TaBCN film, a NbO film, a NbN film, a NbOC film, a NbOCN film, a NbON film, a NbBN film, a NbBCN film, an AlO film, an AlN film, an AlOC film, an AlOCN film, an AlON film, an AlBN film, an AlBCN film, a MoO film, a MoN film, a MoOC film, a MoOCN film, a MoON film, a MoBN film, a MoBCN film, a WO film, a WN film, a WOC film, a WOCN film, a WON film, a MWBN film, a WBCN film, or the like.

In these cases, for example, a tetrakis(dimethylamino)titanium $(Ti[N(CH_3)_2]_4$, abbreviated to TDMAT) gas, a tetrakis(ethylmethylamino)hafnium $(Hf[N(C_2H_5)(CH_3)]_4$, abbreviated to TEMAH) gas, a tetrakis(ethylmethylamino)zirconium $(Zr[N(C_2H_5)(CH_3)]_4$, abbreviated to TEMAZ) gas, a trimethylaluminum $(Al(CH_3)_3$, abbreviated to TMA) gas, a titanium tetrachloride $(TiCl_4)$ gas, a hafnium tetrachloride $(HfCl_4)$ gas, or the like can be used as the source gas. As the reactant gas, the above-described reactant gas can be used.

That is, the present disclosure can be suitably applied to the case of forming a semimetal-based film including a semimetal element or a metal-based film including a metal element. The process procedures and the process conditions of these film-forming processes can be the same as the process procedures and the process conditions in the film-forming processes shown in the embodiments or the modification example described above. In these cases, the same effects as those of the embodiments or the modification example described above can also be obtained.

It is preferable that the recipe used in the film-forming process is individually prepared according to the contents of the processing and are stored in the memory device 121c through the electric communication line or the external memory device 123. It is preferable that, when various processes are started, the CPU 121a appropriately selects a suitable recipe from the plurality of recipes stored in the memory device 121c according to the contents of the processing. Therefore, films having various film types, composition ratios, film qualities, and film thicknesses can be formed in a versatile manner and with good reproducibility by using a single substrate processing apparatus. In addition, since the workload of an operator can be reduced, various processes can be promptly started while avoiding operation mistake.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing apparatus through the telecommunication line or the non-transitory computer-readable recording medium storing the corresponding recipe. In addition, the existing recipe having already been installed on the substrate processing apparatus may be directly modified by operating the I/O device 122 provided in the existing substrate processing apparatus.

As described above, the present disclosure can provide a technology that is capable of improving a film quality of a film to be formed.

What is claimed is:

1. A substrate processing apparatus comprising:
  a process chamber configured to accommodate a plurality of substrates held in multiple stages horizontally in a vertical direction;
  a gas supply unit including at least one nozzle, the at least one nozzle provided in an annular space between an inner wall of the process chamber and the plurality of substrates, and a process gas supply pipe connecting between the at least one nozzle and a process gas source through a mass flow controller and a valve;
  a plasma generation unit including rod-shaped electrodes and an electrode protection pipe, provided in parallel to the at least one nozzle, respectively; and
  a buffer chamber accommodating a part of the plasma generation unit and the at least one nozzle of the gas supply unit, a wall of the buffer chamber having a plurality of gas supply holes arranged vertically, so that a gas being ejected from each of the plurality of gas supply holes flows parallel to each of a surface of the plurality of the substrates, wherein the buffer chamber includes a groove portion connecting the plurality of gas supply holes next to each other in the vertical direction, the groove portion is formed by cutting out a part of a wall surface of the buffer chamber, the wall surface configured to face the plurality of substrates held in multiple stages in a vertical direction, and a width, in a short side direction, of the groove portion is formed to be less than a diameter of each of the plurality of gas supply holes, and greater than or equal to a radius of each of the gas supply holes, wherein the groove portion is formed above an uppermost gas supply hole of the plurality of gas supply holes arranged vertically, and wherein each of the plurality of gas supply holes includes an outlet in a same plane as the groove portion and each of the plurality of gas supply holes supplies the gas directly to the process chamber.

2. The substrate processing apparatus according to claim 1, wherein the groove portion is formed to be shallower than a wall thickness of the buffer chamber.

3. The substrate processing apparatus according to claim 1, wherein a depth of the groove portion is formed to be greater than or equal to ½ of a radius of each of the plurality of gas supply holes.

4. The substrate processing apparatus according to claim 1, wherein the groove portion is provided below a lowermost gas supply hole of the plurality of gas supply holes.

\* \* \* \* \*